(12) United States Patent
Pedersen

(10) Patent No.: US 7,111,110 B1
(45) Date of Patent: Sep. 19, 2006

(54) VERSATILE RAM FOR PROGRAMMABLE LOGIC DEVICE

(75) Inventor: Bruce B Pedersen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 420 days.

(21) Appl. No.: 10/317,263

(22) Filed: Dec. 10, 2002

(51) Int. Cl.
G06F 12/00 (2006.01)

(52) U.S. Cl. ............................ 711/104; 710/8; 716/16; 713/100

(58) Field of Classification Search ................ 711/103, 711/154, 104, 105, 100; 716/17, 16; 326/39; 710/8, 10, 100, 16, 305; 713/100
See application file for complete search history.

(56) References Cited

U.S. PATENT DOCUMENTS

| | | | |
|---|---|---|---|
| 3,473,160 A | 10/1969 | Wahlstrom | 340/172.5 |
| 3,634,829 A | 1/1972 | Campi et al. | 340/172.5 |
| 3,849,638 A | 11/1974 | Greer | 235/152 |
| 4,195,352 A | 3/1980 | Tu et al. | 364/900 |
| 4,293,783 A | 10/1981 | Patil | 307/465 |
| 4,593,373 A | 6/1986 | Kiuchi et al. | 364/736 |
| 4,608,629 A | 8/1986 | Nagel | 711/202 |
| 4,609,986 A | 9/1986 | Hartmann et al. | 364/200 |
| 4,617,479 A | 10/1986 | Hartmann et al. | 307/465 |
| 4,642,487 A | 2/1987 | Carter | 307/465 |
| 4,670,749 A | 6/1987 | Freeman | 340/825.85 |
| 4,677,318 A | 6/1987 | Veenstra | 307/465 |
| 4,706,216 A | 11/1987 | Carter | 365/94 |
| 4,713,792 A | 12/1987 | Hartmann et al. | 364/900 |
| 4,740,917 A | 4/1988 | Denis et al. | 365/49 |
| 4,751,671 A | 6/1988 | Babetski et al. | 364/900 |
| 4,758,745 A | 7/1988 | Elgamal et al. | 307/465 |
| 4,758,985 A | 7/1988 | Carter | 365/94 |
| 4,774,421 A | 9/1988 | Hartmann et al. | 307/465 |
| 4,780,847 A | 10/1988 | Ito | 365/154 |
| 4,783,606 A | 11/1988 | Goetting | 307/465 |
| 4,796,232 A | 1/1989 | House | 365/189.03 |
| 4,825,414 A | 4/1989 | Kawata | 365/189 |
| 4,831,591 A | 5/1989 | Imazeki et al. | 365/189.08 |
| 4,855,958 A | 8/1989 | Ikeda | 365/230.08 |
| 4,870,302 A * | 9/1989 | Freeman | 326/41 |
| 4,871,930 A | 10/1989 | Wong et al. | 307/465 |
| 4,875,196 A | 10/1989 | Spaderna et al. | 365/238 |
| 4,876,466 A | 10/1989 | Kondou et al. | 307/465 |
| 4,899,067 A | 2/1990 | So et al. | 307/465 |
| 4,903,236 A | 2/1990 | Nakayama et al. | 365/185 |
| 4,912,342 A | 3/1990 | Wong et al. | 307/465 |
| 4,912,345 A | 3/1990 | Steele et al. | 307/465 |

(Continued)

FOREIGN PATENT DOCUMENTS

EP 0 081 917 A1 6/1983

(Continued)

OTHER PUBLICATIONS

Actel Corporation, "Integrator Series FPGAs—1200XL and 3200DX Families" Data Sheet, pp. 1-8, Sep. 1997.

(Continued)

*Primary Examiner*—Pierre-Michel Bataille
(74) *Attorney, Agent, or Firm*—Fish & Neave IP Group Ropes & Gray LLP

(57) ABSTRACT

Circuits and methods for providing versatile RAM for a programmable logic device are provided. These circuits and methods preferably allow signal lines that may be used to provide inputs for logic elements to be used instead for addressing memory blocks that form the versatile RAM.

27 Claims, 6 Drawing Sheets

U.S. PATENT DOCUMENTS

| | | | |
|---|---|---|---|
| 4,928,266 A | 5/1990 | Abbott et al. | 365/189.01 |
| 4,942,541 A | 7/1990 | Hoel et al. | 364/519 |
| 4,963,770 A | 10/1990 | Keida | 307/465 |
| 4,975,601 A | 12/1990 | Steele | 307/465 |
| 5,010,519 A | 4/1991 | Yoshimoto et al. | 365/149 |
| 5,018,102 A | 5/1991 | Houston | 365/95 |
| 5,027,011 A | 6/1991 | Steele | 307/465 |
| 5,027,326 A | 6/1991 | Jones | 365/221 |
| 5,029,141 A | 7/1991 | Yoshimoto et al. | 365/230.05 |
| 5,042,004 A | 8/1991 | Agrawal et al. | 364/900 |
| 5,089,993 A | 2/1992 | Neal et al. | 365/63 |
| 5,099,150 A | 3/1992 | Steele | 307/465 |
| 5,115,411 A | 5/1992 | Kass et al. | 365/189.01 |
| 5,121,006 A | 6/1992 | Pedersen | 307/465 |
| 5,122,685 A | 6/1992 | Chan et al. | 307/465.1 |
| 5,128,559 A | 7/1992 | Steele | 307/465 |
| 5,138,577 A | 8/1992 | Oh | 365/189.05 |
| 5,144,582 A | 9/1992 | Steele | 365/189.08 |
| 5,146,428 A | 9/1992 | Tanimura | 365/189.08 |
| 5,177,706 A | 1/1993 | Shinohara et al. | 365/189.04 |
| 5,212,652 A | 5/1993 | Agrawal et al. | 364/489 |
| 5,220,214 A | 6/1993 | Pedersen | 307/465 |
| 5,226,005 A | 7/1993 | Lee et al. | 365/49 |
| RE34,363 E | 8/1993 | Freeman | 307/465 |
| 5,237,219 A | 8/1993 | Cliff | 307/465 |
| RE34,444 E | 11/1993 | Kaplinsky | 340/825.8 |
| 5,258,668 A | 11/1993 | Cliff et al. | 307/465 |
| 5,260,610 A | 11/1993 | Pedersen et al. | 307/465 |
| 5,260,611 A | 11/1993 | Cliff et al. | 307/465 |
| 5,270,587 A | 12/1993 | Zagar | 307/469 |
| 5,274,581 A | 12/1993 | Cliff et al. | 364/784 |
| 5,282,163 A | 1/1994 | Shibata | 365/189.08 |
| 5,291,444 A | 3/1994 | Scott et al. | 365/189.05 |
| 5,302,865 A | 4/1994 | Steele et al. | 307/465 |
| 5,307,319 A | 4/1994 | Kohketsu et al. | 365/230.08 |
| 5,313,119 A | 5/1994 | Cooke et al. | 307/465.1 |
| 5,313,430 A | 5/1994 | Rawlins et al. | 365/229 |
| 5,315,178 A | 5/1994 | Snider | 307/465 |
| 5,319,589 A | 6/1994 | Yamagata et al. | 365/49 |
| 5,329,460 A | 7/1994 | Agrawal et al. | 364/489 |
| 5,336,950 A | 8/1994 | Popli et al. | 307/465 |
| 5,339,268 A | 8/1994 | Machida | 365/49 |
| 5,343,406 A | 8/1994 | Freeman et al. | 364/490 |
| 5,349,250 A | 9/1994 | New | 307/465 |
| 5,350,954 A | 9/1994 | Patel | 307/465 |
| 5,352,940 A | 10/1994 | Watson | 307/465 |
| 5,362,999 A | 11/1994 | Chiang | 326/44 |
| 5,371,422 A | 12/1994 | Patel et al. | 326/41 |
| 5,383,146 A | 1/1995 | Threewitt | 365/49 |
| 5,386,155 A | 1/1995 | Steele et al. | 326/37 |
| 5,396,608 A | 3/1995 | Garde | 395/400 |
| 5,408,434 A | 4/1995 | Stansfield | 365/189.08 |
| 5,414,377 A | 5/1995 | Freidin | 326/41 |
| 5,425,036 A | 6/1995 | Liu et al. | 371/23 |
| 5,426,378 A | 6/1995 | Ong | 326/39 |
| 5,426,612 A | 6/1995 | Ichige et al. | 365/220 |
| 5,432,719 A | 7/1995 | Freeman et al. | 364/579 |
| 5,436,575 A | 7/1995 | Pedersen et al. | 326/40 |
| 5,448,522 A | 9/1995 | Huang | 365/189.04 |
| 5,450,608 A | 9/1995 | Steele | 395/800 |
| 5,469,400 A | 11/1995 | Yamano | 365/230.01 |
| 5,471,425 A | 11/1995 | Yumitori et al. | 365/190 |
| 5,473,267 A | 12/1995 | Stansfield | 326/41 |
| 5,488,316 A | 1/1996 | Freeman et al. | 326/41 |
| 5,506,850 A | 4/1996 | Osann, Jr. | 371/22.1 |
| 5,532,957 A | 7/1996 | Malhi | 365/154 |
| 5,535,342 A * | 7/1996 | Taylor | 710/315 |
| 5,541,530 A | 7/1996 | Cliff et al. | 326/41 |
| 5,543,732 A | 8/1996 | McClintock et al. | 326/41 |
| 5,550,782 A | 8/1996 | Cliff et al. | 365/230.03 |
| 5,555,214 A | 9/1996 | Sung et al. | 365/221 |
| 5,557,218 A | 9/1996 | Jang | 326/40 |
| 5,559,450 A | 9/1996 | Ngai et al. | 326/40 |
| 5,559,747 A | 9/1996 | Kasamizugami et al. | 365/207 |
| 5,566,123 A | 10/1996 | Freidin et al. | 365/230.05 |
| 5,570,040 A | 10/1996 | Lytle et al. | 326/41 |
| 5,572,148 A | 11/1996 | Lytle et al. | 326/41 |
| 5,574,930 A | 11/1996 | Halverson et al. | 395/800 |
| 5,590,087 A | 12/1996 | Chung et al. | 365/230.05 |
| 5,592,106 A | 1/1997 | Leong et al. | 326/41 |
| 5,600,263 A * | 2/1997 | Trimberger et al. | 326/39 |
| 5,604,453 A | 2/1997 | Pedersen | 327/112 |
| 5,611,064 A | 3/1997 | Maund et al. | 711/209 |
| 5,614,840 A | 3/1997 | McClintock et al. | 326/41 |
| 5,628,020 A * | 5/1997 | O'Brien | 713/322 |
| 5,631,577 A | 5/1997 | Freidin et al. | 326/40 |
| 5,633,830 A | 5/1997 | Sung et al. | 365/221 |
| 5,640,107 A * | 6/1997 | Kruse | 326/38 |
| 5,648,732 A | 7/1997 | Duncan | 326/40 |
| 5,652,730 A | 7/1997 | Kono et al. | 365/226 |
| 5,668,771 A | 9/1997 | Cliff et al. | 365/230.03 |
| 5,671,179 A | 9/1997 | Javanifard | 365/185.33 |
| 5,689,195 A | 11/1997 | Cliff et al. | 326/41 |
| 5,694,354 A | 12/1997 | Anami et al. | 365/154 |
| 5,696,455 A | 12/1997 | Madurawe | 326/41 |
| 5,708,597 A | 1/1998 | Kelem | 365/230.03 |
| 5,715,197 A | 2/1998 | Nance et al. | 365/189.02 |
| 5,717,901 A | 2/1998 | Sung et al. | 395/497.01 |
| 5,744,980 A | 4/1998 | McGowan et al. | 326/40 |
| 5,757,207 A | 5/1998 | Lytle et al. | 326/39 |
| 5,758,192 A | 5/1998 | Alfke | 395/877 |
| 5,760,607 A * | 6/1998 | Leeds et al. | 326/38 |
| 5,764,583 A | 6/1998 | Cliff et al. | 365/230.03 |
| 5,768,207 A | 6/1998 | Raad et al. | 365/226 |
| 5,787,007 A * | 7/1998 | Bauer | 716/16 |
| 5,796,269 A | 8/1998 | New | 326/40 |
| 5,801,547 A * | 9/1998 | Kean | 326/40 |
| 5,802,540 A | 9/1998 | Sung et al. | 711/1 |
| 5,804,986 A | 9/1998 | Jones | 326/40 |
| 5,809,281 A | 9/1998 | Steele et al. | 395/497.01 |
| 5,812,479 A | 9/1998 | Cliff et al. | 365/230.03 |
| 5,815,003 A | 9/1998 | Pedersen | 326/39 |
| 5,815,726 A | 9/1998 | Cliff | 395/800.01 |
| 5,828,229 A | 10/1998 | Cliff et al. | 326/40 |
| 5,835,405 A | 11/1998 | Tsui et al. | 365/182 |
| 5,838,628 A | 11/1998 | Cliff et al. | 265/230.03 |
| 5,844,854 A | 12/1998 | Lee | 365/230.01 |
| 5,848,005 A | 12/1998 | Cliff et al. | 365/230.03 |
| 5,883,850 A | 3/1999 | Lee et al. | 365/230.03 |
| 5,886,538 A | 3/1999 | New | 326/40 |
| 5,889,413 A | 3/1999 | Bauer | 326/40 |
| 5,898,893 A | 4/1999 | Alfke | 395/877 |
| 5,901,079 A | 5/1999 | Chiu et al. | 365/154 |
| 5,909,126 A | 6/1999 | Cliff et al. | 326/41 |
| 5,926,036 A | 7/1999 | Cliff et al. | 326/40 |
| 5,933,023 A * | 8/1999 | Young | 326/40 |
| 5,933,369 A | 8/1999 | Johnson et al. | 365/189.05 |
| 5,936,873 A | 8/1999 | Kongetira | 365/49 |
| 5,940,852 A | 8/1999 | Rangasayee et al. | 711/108 |
| 5,946,219 A * | 8/1999 | Mason et al. | 716/16 |
| 5,946,704 A | 8/1999 | Yoneda et al. | 711/108 |
| 5,956,748 A | 9/1999 | New | 711/149 |
| 5,977,791 A | 11/1999 | Veenstra | 326/40 |
| 5,978,260 A * | 11/1999 | Trimberger et al. | 365/182 |
| 5,978,862 A * | 11/1999 | Kou et al. | 710/14 |
| 6,005,796 A | 12/1999 | Sywyk et al. | 365/156 |
| 6,011,730 A | 1/2000 | Sample et al. | 365/189.05 |
| 6,011,744 A | 1/2000 | Sample et al. | 365/230.03 |
| 6,018,490 A | 1/2000 | Cliff et al. | 365/230.03 |
| 6,020,759 A | 2/2000 | Heile | 326/40 |
| 6,023,439 A | 2/2000 | Cliff et al. | 365/230.03 |
| 6,028,808 A | 2/2000 | Cliff et al. | 365/230.03 |
| 6,029,236 A | 2/2000 | Steele et al. | 711/170 |
| 6,038,627 A | 3/2000 | Plants | 710/100 |

| | | | |
|---|---|---|---|
| 6,041,000 A | 3/2000 | McClure et al. ............. 365/200 |
| 6,049,223 A | 4/2000 | Lytle et al. ..................... 326/40 |
| 6,049,487 A | 4/2000 | Plants et al. ............. 365/189.04 |
| 6,052,327 A | 4/2000 | Reddy et al. .......... 365/230.05 |
| 6,061,417 A | 5/2000 | Kelem .......................... 377/26 |
| 6,064,599 A | 5/2000 | Cliff et al. ............. 365/189.01 |
| 6,072,332 A | 6/2000 | Pedersen ...................... 326/40 |
| 6,075,380 A | 6/2000 | Lane ............................ 326/40 |
| 6,078,528 A | 6/2000 | Johnson et al. ......... 365/189.05 |
| 6,101,132 A | 8/2000 | Goetting et al. ....... 365/189.02 |
| 6,104,208 A | 8/2000 | Rangasayee ................. 326/40 |
| 6,112,020 A * | 8/2000 | Wright ......................... 716/17 |
| 6,115,312 A | 9/2000 | Jefferson et al. ............ 365/228 |
| 6,118,298 A | 9/2000 | Bauer et al. .................. 326/39 |
| 6,118,720 A | 9/2000 | Heile .................... 365/230.01 |
| 6,127,843 A | 10/2000 | Agrawal et al. .............. 326/40 |
| 6,128,692 A | 10/2000 | Sung et al. ..................... 711/1 |
| 6,134,166 A | 10/2000 | Lytle et al. ................. 365/221 |
| 6,134,173 A | 10/2000 | Cliff et al. ............. 365/230.03 |
| 6,144,220 A | 11/2000 | Young .......................... 326/41 |
| 6,144,573 A | 11/2000 | Heile ........................... 365/49 |
| 6,150,838 A | 11/2000 | Wittig et al. .................. 326/39 |
| 6,150,839 A * | 11/2000 | New et al. .................... 326/40 |
| 6,151,258 A | 11/2000 | Sample et al. ......... 365/189.05 |
| 6,157,212 A | 12/2000 | Lane ............................ 326/40 |
| 6,160,419 A | 12/2000 | Veenstra et al. .............. 326/40 |
| RE37,060 E | 2/2001 | Sung et al. .................. 365/221 |
| 6,184,709 B1 | 2/2001 | New ............................. 326/40 |
| 6,184,712 B1 | 2/2001 | Wittig et al. .................. 326/41 |
| 6,191,998 B1 | 2/2001 | Reddy et al. .......... 365/230.05 |
| 6,198,304 B1 | 3/2001 | Sasaki .......................... 326/39 |
| 6,208,163 B1 | 3/2001 | Wittig et al. .................. 326/39 |
| 6,215,326 B1 | 4/2001 | Jefferson et al. .............. 326/41 |
| 6,218,860 B1 | 4/2001 | Lytle et al. .................... 326/41 |
| RE37,195 E * | 5/2001 | Kean ............................ 326/39 |
| 6,242,946 B1 | 6/2001 | Veenstra ....................... 326/41 |
| 6,249,143 B1 | 6/2001 | Zaveri et al. .................. 326/40 |
| 6,260,139 B1 * | 7/2001 | Alfke ............................ 713/1 |
| 6,262,597 B1 | 7/2001 | Bauer et al. .................. 326/41 |
| 6,262,933 B1 | 7/2001 | Chang et al. .......... 365/230.06 |
| 6,263,400 B1 | 7/2001 | Rangasayee et al. ........ 711/108 |
| 6,282,127 B1 | 8/2001 | Pang et al. ............. 365/189.02 |
| 6,288,568 B1 | 9/2001 | Bauer et al. .................. 326/39 |
| 6,288,569 B1 | 9/2001 | Wittig et al. .................. 326/40 |
| 6,288,970 B1 | 9/2001 | Reddy et al. .......... 365/230.05 |
| 6,292,017 B1 | 9/2001 | Rangasayee ................. 326/40 |
| 6,297,665 B1 | 10/2001 | Bauer et al. .................. 326/40 |
| 6,317,367 B1 | 11/2001 | Sample et al. ......... 365/189.08 |
| 6,323,680 B1 | 11/2001 | Pedersen et al. .............. 326/41 |
| 6,340,897 B1 * | 1/2002 | Lytle et al. .................... 326/40 |
| 6,344,989 B1 | 2/2002 | Heile .......................... 365/49 |
| 6,347,061 B1 | 2/2002 | Heile .................... 365/230.01 |
| 6,356,110 B1 | 3/2002 | Reddy et al. .................. 326/41 |
| 6,400,635 B1 | 6/2002 | Ngai et al. ............. 365/230.05 |
| 6,453,382 B1 | 9/2002 | Heile ......................... 711/108 |
| 6,462,577 B1 | 10/2002 | Lee et al. ..................... 326/40 |
| 6,467,017 B1 | 10/2002 | Ngai et al. .................. 711/104 |
| 6,754,726 B1 * | 6/2004 | Kuo .............................. 710/8 |
| 6,976,118 B1 * | 12/2005 | Baier ......................... 711/103 |
| 7,030,646 B1 * | 4/2006 | Tyson ........................... 326/38 |

FOREIGN PATENT DOCUMENTS

| | | |
|---|---|---|
| EP | 0 156 316 A2 | 2/1985 |
| EP | 0 306 726 A2 | 3/1989 |
| EP | 0 410 759 A2 | 1/1991 |
| EP | 0 415 542 A2 | 3/1991 |
| EP | 0 420 389 A1 | 4/1991 |
| EP | 0 507 507 A2 | 10/1992 |
| EP | 0 509 135 A1 | 10/1992 |
| EP | 0 523 995 A1 | 1/1993 |
| EP | 0 530 985 A2 | 3/1993 |
| EP | 0 569 137 A2 | 11/1993 |
| EP | 0 780 846 A2 | 6/1997 |
| GB | 2 281 427 A | 1/1995 |
| JP | 1-91525 | 4/1989 |
| JP | 1-91526 | 4/1989 |
| WO | WO 94/10754 | 5/1994 |
| WO | WO 95/16993 | 6/1995 |

OTHER PUBLICATIONS

Altera Corporation, Implementing Dual-Port RAM in FLEX 10K Devices, Application Note 65, San Jose, CA, Feb. 1996, ver. 1, pp. 1-8.

Altera Corporation, "Altera Enables System-Level Integration with Raphael Family of Embedded PLDs", San Jose, California, pp. 1-3, Aug. 31, 1998.

Altera Corporation, "Altera Unveils New Name for Raphael: Advanced Programmable Embedded Matrix (APEX)", San Jose, California, pp. 1-3, Oct. 7, 1998.

Altera Corporation, Apex Device Family; Breakthrough MultiCore Architecture, Altera Corporation, San Jose, California, after Aug. 31, 1998.

Altera Corporation, Apex Device Family; The Embedded PLD Family for System-Level Integration, San Jose, California, after Aug. 31, 1998.

Altera Corporation, Apex 20K Programmable Logic Device Family, Data Sheet, Mar. 2000, ver. 2.06, San Jose, CA, pp. 1-208.

Altera Corporation, Apex 20K Programmable Logic Device Family; Advance Product Brief, San Jose, California, Oct. 1998, pp. 1, 2, and 9.

Altera Corporation, Flex 10K Embedded Programmable Logic Family, Data Sheet, Jun. 1999, ver. 4.01, San Jose, CA, pp. 1-137.

Altera Corporation, Flex 10KE Embedded Programmable Logic Family, Data Sheet, Aug. 1999, ver. 2.02, San Jose, CA, pp. 1-120.

AT&T Microelectronics, "Optimized reconfigurable cell array (ORCA) series field-programmable gate arrays," pp. 1-87 (Advance Data Sheet, Feb. 1985).

AT&T's Orthogonal ORCA Targets the FPGA Future, *8029 Electronic Engineering*, 64, No. 786, Jun. 1992, pp. 9-10.

Barre, C., "L'utilisation du FPLA; Evaluez les Applications d'un Composant Puissant qui Peut se Reveler trés Economique", *Electronique & Applications Industrielles*, EAI 250, Apr. 1, 1978, pp. 21-25.

Bursky, D., "Shrink Systems with One-Chip Decoder, EPROM, and RAM," *Electronic Design*, Jul. 28, 1988, pp. 91-94.

Bursky, "Combination RAM/PLD Opens New Application Options," *Electronic Design*, May 23, 1991, pp. 138, 140.

Bursky, D., "FPGA Advances Cut Delays, Add Flexibility," 2328 *Electronic Design*, 40, No. 20, Oct. 1, 1992, pp. 35, 38, 40, 42, and 43.

Bursky, D., "Denser, Faster FPGAs Vie for Gate-Array Applications," 2328 *Electronic Design*, 41, No. 11, May 27, 1993, pp. 55, 56, 58, 62, 63, 64, 68, 70, 71, 74, and 75.

Casselman, "Virtual Computing and The Vitual Computer," *IEEE*, Jul. 1993, pp. 43-48.

Chow, P. et al., "A 1.2µm CMOS FPGA using Cascaded Logic Blocks and Segmented Routing", FPGAs, Chapter 3.2, pp. 91-102, W.R. Moore and W. Luk (eds.), Abingdon EE&CS Books, Abingdon, (UK), 1991.

DeHon, A., "Reconfigurable Architectures for General-Purpose Computing", M.I.T. Ph.D. thesis, Sep. 1996.

El Gamal et al., "An Architecture for Electrically Configurable Gate Arrays," *IEEE Journal of Solid-State Circuits*, vol. 24, No. 2, Apr. 1989, pp. 394-398.

El-Ayat et al., "A CMOS Electrically Configurable Gate Array," *IEEE Journal of Solid-State Circuits*, vol. 24, No. 3, Jun. 1989, pp. 752-762.

Fletcher, William I., et al., "Simplify Sequential Circuit Designs with Programmable ROMs", *Electronic Design*, Jul. 8, 1971, pp. 70-72.

Hauser, J.R., et al., "Garp: A MIPS Processor with a Reconfigurable Coprocessor", 0-8186-8159-4/97 $10.00 © 1997 IEEE, pp. 12-21.

Heile, F. et al., "Hybrid Product Term and LUT Based Architectures Using Embedded Memory Blocks", *Proceedings of FPGA 1999 Conference*, Feb. 21-23, 1999, Monterey, California.

Hemel, Albert, "Making Small ROM's [sic] Do Math Quickly, Cheaply and Easily", *Electronics*, May 11, 1970, pp. 104-111.

Hsieh et al., "Third Generation Architecture Boosts Speed and Density of Field Programmable Gate Arrays," *Proc. of IEEE CiCC Conf.*, May 1990, pp. 31.2.1 to 31.2.7.

Hu, S.C., "Cellular Synthesis of Synchronous Sequential Machines," *IEEE Transactions on Computers*, Dec. 1972, pp. 1399-1405.

Intel Corporation iFX8160 10ns FLEXlogic FPGA with SRAM Option; Advance Information, Intel Corporation, Oct. 1993, pp. 2-47 through 2-56.

Intel Corporation, iFX780 10ns FLEXlogic FPGA with SRAM Option; Preliminary, Nov. 1993, Order No. 290459-004, pp. 2-24 through 2-46.

Iwanczuk, R., "Using the XC4000 RAM Capability", XAPP 031. 000, Xilinx, Inc., San Jose, CA.

Kambayashi, Yahiko, "Logic Design of Programmable Logic Arrays", *IEEE Transactions on Computers*, vol. C-28, No. 9, Sep. 1979, pp. 609-617.

Kavtz, W., "Cellular Logic-in-Memory Arrays," *IEEE Trans. on Computers*, vol. C-18, No. 8, Aug. 1969, pp. 719-727.

Kaviani, A., et al., "Hybrid FPGA Architecture", *Proceedings 4th International Symposium on FPGAs (FPGA 96)*, Feb. 1996.

Kawana, K. et al., "An Efficient Logic Block Interconnect Architecture for User-Reprogrammable Gate Array," *IEEE 1990 Custom Integrated Circuits Conf.*, May 1990, CH2860-5/90/0000-0164, pp. 31.3.1 to 31.3.4.

Klein, B., "Use LFSRs to Build Faster FPGA-Based Counters", *Electronic Design*, Mar. 21, 1994, pp. 87, 88, 90, 94, 96, 97, and 100.

Kvamme, Floyd, "Standard Read-Only Memories Simplify Complex Logic Design", *Electronics*, Jan. 5, 1970, pp. 88-95.

Landry, S., "Application-Specific ICs, Relying on RAM, Implement Almost Any Logic Function," *Electronic Design*, Oct. 31, 1985, pp. 123-130.

Larsson, T, "Programmable Logic Circuits: The Luxury Alternatives are Coming Soon," *Elteknik-med-Aktuell ElectroniK*, No. 4, Feb. 25-Mar. 9, 1988, pp. 37-38, (with English abstract).

Ling et al., "WASMII: A Data Driven Computer on a Virtual Hardware," *Proc. of IEEE Field Prog. Custom Computing Machines Conf.*, Napa, California, Apr. 1993, pp. 33-42.

Lucent Technologies Inc., ORCA™ OR2CxxA (5.0 V) and OR2TxxA (3.3 V) Series Field-Programmable Gate Arrays data sheet, Aug. 1996.

Manning, "An Approach to Highly Integrated Computer Maintained Cellular Arrays" *IEEE Trans. on Computers*, vol. C-26, No. 6, Jun. 1977, pp. 536-552.

Masumoto, R. T., "Configurable On-Chip RAM Incorporated into High Speed Logic Array," *IEEE Custom Integrated Circuits Conference*, Jun. 1985, CH2157-6/85/0000-0240, pp. 240-243.

Minnick, R. C., "A Survey of Microcellular Research," *Journal of the Association for Computing Machinery*, vol. 14, No. 2, pp. 203-241, Apr. 1967.

Mintzer, L., "FIR Filters with the Xilinx FPGA", *FPGA '92* #129-#134.

Mukhopadhyay, A., *Recent Developments in Switching Theory*, Academic Press, New York, 1971, chapters VI and IX, pp. 229-254 and 369-422.

Ngai, Kai-Kit Tony, "An SRAM-Programmable Field-Reconfigurable Memory," Presentation at University of Toronto, Canada, Jun. 1993, pp. 1-14.

Ngai, T. K-K., "An SRAM-Programmable Field-Reconfigurable Memory", Master of Applied Science degree thesis submitted to the Department of Electrical Engineering of the University of Toronto, 1994.

Nichols, John L., "A Logical Next Step for Read-Only Memories", *Electronics*, Jun. 12, 1967, pp. 111-113.

Ohta, A., et al., "New FPGA Architecture for Bit-Serial Pipeline Datapath", 0-8186-8900-5/98 $10.00 © 1998 IEEE, pp. 58-67.

Page, E.W., "Programmable Array Realizations of Sequential Machines," Department of Electrical Engineering, Duke University, Doctorial Dissertation, 1973.

Patil et al., "A Programmable Logic Approach for VLSI," *IEEE Trans. on Computers*, vol. C-28, No. 9, Sep. 1979, pp. 594-601.

Plus Logic "FPSL5110 Intelligent Data Buffer" Product Brief, Plus Logic, Inc., San Jose, California, Oct. 1990, pp. 1-6.

Quenot et al., "Reconfigurable Compute Engine for Real-Time Vision Automata Prototyping," *Proc. of IEEE CFFM Conf.*, Napa, California, Feb. 1994, pp. 91-100.

Quinnell, R.A., "FPGA Family Offers Speed, Density, On-Chip RAM, and Wide-Decode Logic," *EDN*, Dec. 6, 1990, pp. 62, 64.

Satoh, H. et al., "A 209K-Transistor ECL Gate Array with RAM," *IEEE Jor. of Solid-State Circuits*, vol. 24, No. 5, Oct. 1989, pp. 1275-1279.

Seitz, "Concurrent VLSI Architectures," *IEEE Trans. on Computers*, vol. C-33, No. 12, Dec. 1984, pp. 1247-1265.

Sholl, Howard A., et al., "Design of Asynchronous Sequential Networks Using Read-Only Memories", *IEEE Transactions on Computers*, vol. C-24, No. 2, Feb. 1975, pp. 195-206.

Shubat, A. et al., "A Family of User-Programmable Peripherals with a Functional Unit Architecture," *IEEE Jor. of Solid-State Circuits*, vol. 27, No. 4, Apr. 1992, 0018-9200/92$03.00, pp. 515-529.

Smith, D., "Intel's FLEXlogic FPGA Architecture," *IEEE 1063-6390/93*, 1993 pp. 378-384.

Stansfield, A., et al., "The Design of a New FPGA Architecture", Proceedings Field Programmable Logic (FPL) 1995, *Springer Lecture Notes in Computer Science 975*, pp. 1-14.

Stone, "A Logic in Memory Computer," *IEEE Trans. on Computers*, Jan. 1970, pp. 73-78.

Triscend Corporation, *Triscend E5 Configurable System-on-Chip Family*, Jan. 2000 (Version 1.00) Product Description, cover page and pp. 25-28.

Wahlstrom, S. E., "Programmable Logic Arrays—Chapter by the Millions," *Electronics*, Dec. 11, 1967, pp. 90-95.

Weinberger, Arnold, "High-Speed Programmable Logic Array Adders", *IBM J. Res. Develop.*, vol. 23, No. 2, Mar. 1979, pp. 163-178.

Xilinx, Inc. *The Programmable Logic Data Book*, 1993.

Xilinx Inc., *The Programmable Logic Data Book*, 1994, San Jose, CA, cover pages and pp. 2-5 through 2-102 ("SC4000 Logic Cell Array Families").

Xilinx, Inc., XC5000 Logic Cell Array Family, *Technical Data, Advance Information*, Feb. 1995.

Xilinx Inc., *The Programmable Logic Data Book*, 1996 San Jose, CA.

Xilinx, Inc, Next Generation FPGAs; Xilinx Next Generation FPGAs Deliver World-Class Performance, The Power of Innovation 1997, San Jose, CA, p. 7-7.

Nilinx, Inc., "XC4000E and XC4000X Series Field Programmable Gate Arrays" data sheet, Version 1.4, Nov. 10, 1997.

Xilinx, Inc. *The Programmable Logic Data Book*, 1999.

Xilinx Inc., *XC4000E and XC4000X Series Field Programmable Gate Arrays; Product Specification*, May 14, 1999 (Version 1.6), San Jose, CA, pp. 6-5 through 6-72.

Xilinx Inc., *XC4000XLA/XV Field Programmable Gate Arrays; Product Specification*, DS015 (v1.3) Oct. 18, 1999, San Jose, CA, pp. 6-157 through 6-170.

Xilinx, Inc., *Vertex 2.5V Field Programmable Gate Arrays*, DS003 (v. 2.0), Preliminary Product Specification, Mar. 9, 2000, San Jose, CA, pp. 1-72.

Xilinx Inc., *VirtexTM-E 1.8V Extended Memory Field Programmable Gate Arrays*, DS025 (v1.0) Mar. 23, 2000, Advance Product Specification, San Jose, CA, pp. 1 and 6.

\* cited by examiner

VERSATILE RAM FOR PROGRAMMABLE LOGIC DEVICE

BACKGROUND OF THE INVENTION

This invention relates to methods and systems for data storage on Programmable Logic Devices (PLDs). More particularly, this invention relates to configuring data storage on PLDs in a versatile fashion. U.S. Pat. No. 6,144,573 describes memory circuits and is hereby incorporated by reference herein in its entirety.

Designs that are implemented in Programmable Logic Devices (PLDs) often require RAM blocks of various sizes. Some designs require relatively shallow, wide RAM—e.g., 16 bits wide by 256 words deep—, while some designs require relatively deep, narrow RAM—e.g., 1 bit wide by 4K words deep—, and some designs require an odd mixture of the two.

In order to implement RAM efficiently, PLDs may contain dedicated circuitry for implementing RAM blocks.

It would be desirable to provide an improved circuitry and methods for implementing RAM in a PLD. It would also be desirable to provide circuitry and methods for reducing the amount of routing resources required when using the extremely wide RAMs.

SUMMARY OF THE INVENTION

It is an advantage of the present invention that it provides an improved circuitry and methods for implementing RAM in a PLD. It is a further advantage of the present invention that it provides improved circuitry and methods for reducing the amount of routing resources required when using relatively extremely wide RAMs.

A programmable logic device (PLD) typically includes an array of logic elements (LEs), where each logic element may include a lookup-table (LUT), preferably 16-bit, feeding a register. These LEs are typically grouped together in groups of eight in a Logic Array Block (LAB) that contains routing resources for applying signals to the inputs of the LUTs of the LEs contained in that LAB and routing resources for receiving the output signals from the LEs and driving the output signals onto other signal lines. A PLD may also have programmable resources for routing the outputs of LEs from and between the LABs. A PLD will typically contain 10,000–100,000 LEs but may contain even more than 100,000 LEs.

If the only storage elements on a PLD were the register in each of these LEs, then building a RAM out of these LEs would be relatively very expensive (i.e., require a large amount of system resources)—a single 16K bit RAM may consume an entire PLD. Because of this disadvantage, PLDs typically include additional special circuitry to more efficiently enable the implementation of already-existent RAMs in the PLD.

Known embodiments of PLDs have attempted to add special circuitry to each LE in order to allow the 16-bits of configuration memory for the LUT to be used as general-purpose RAM. One disadvantage of this solution is that the LUT is no longer available for use as logic, and the amount of extra logic and routing resources required to create RAMs that are deeper than 16 bits (by stitching these smaller blocks together) is still quite expensive.

Circuits and methods according to the invention preferably provide the following solutions in order to efficiently implement RAMs in the PLD. Circuits and methods according to the invention preferably provide flexible or versatile RAM that may either be used as a single large block of RAM, or may be used as individual blocks of RAM or, in the alternative may be used as both substantially simultaneously. These circuits and methods are obtained, at least in part, by using a flexible addressing scheme for individual memory blocks.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

RAM in a PLD requires addressing to identify the location in memory that is either being written to or read from. As described in the background of the invention, different designs require different memory configurations. The circuits and methods according to the invention preferably distribute memory blocks such that an individual memory block—e.g., 256-bit, dual port (the number of ports being determined by the number of distinct sets of "address" lines that feed the RAM)—may be associated with a single LAB. Furthermore, the circuits and methods according to the invention preferably provide at least two different methods of addressing at least a portion of the addresses in the individual memory blocks. Using a first method of addressing, wherein a single addressing scheme is used, the memory blocks may be conglomerated to operate as a single, large memory block. Using an alternative method, the portions of the resources found in each of the LABs may be used to address the memory block associated with the LAB. Thus, two alternative methods of addressing the individual RAM blocks are provided.

These alternative methods of addressing the RAM blocks allow the RAM blocks to be treated as either a large block of RAM, as smaller blocks of RAM, or as some combination of the two. When the RAM blocks are treated as a large block of RAM, they may preferably each be addressed by an "EAB LAB" (Embedded Array Block Logic Array Block) which provides and coordinates addressing, data, and read enable or write enable functions to each of the memory blocks. When some or all of the RAM are treated as individual blocks associated with individual LABs, the addressing to the individual blocks of memory may be provided by the individual LABs associated with each of the memory blocks.

It should be noted that, in one embodiment of the invention, when the addressing is provided by the LABs, the logic capabilities of selected LEs within the LABs, which may comprise about 25% of the total resources of the LABs, may be sacrificed in order to implement the addressing. Nevertheless, the other LEs (methods and systems according to the invention typically require utilizing only two of the eight LEs in a LAB for addressing) and resources of the LABs, such as registers or routing resources, may still be available.

Figure 1:
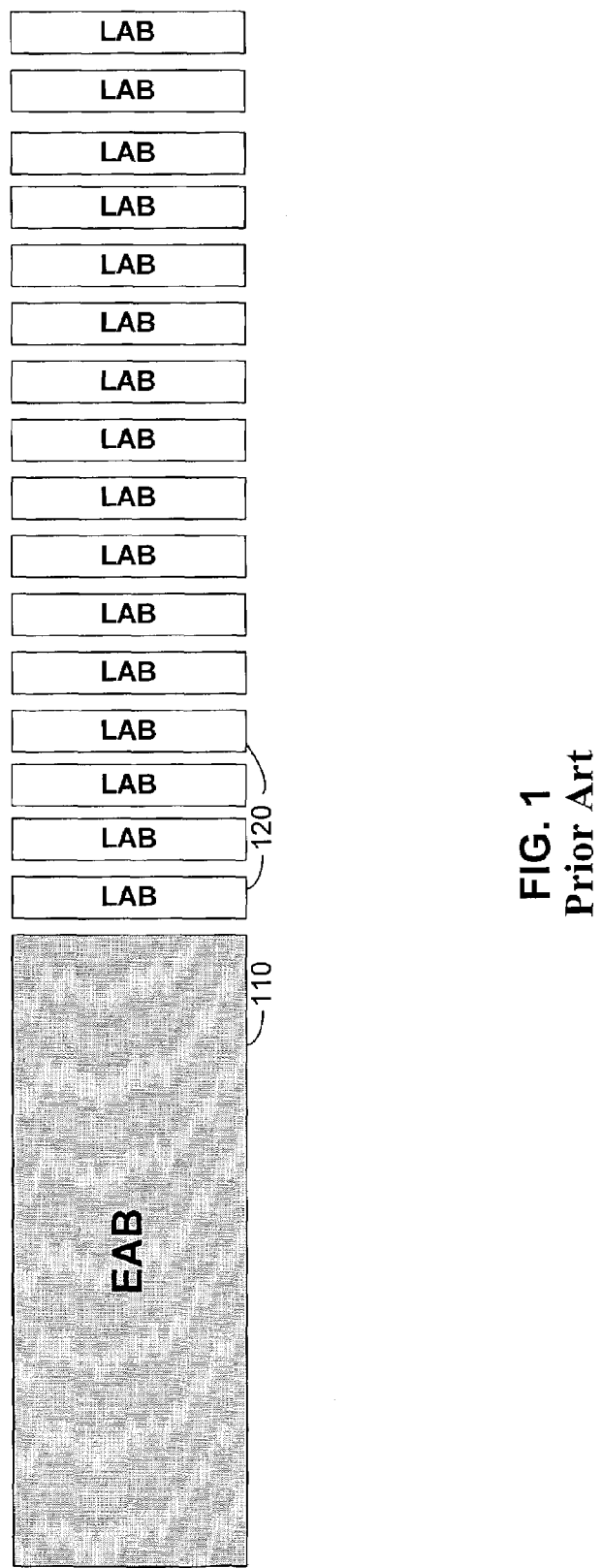
FIG. 1 is a schematic representation of a conventional arrangement of an Embedded Array Block and Logic Array Blocks in a programmable logic device.

FIG. 1 shows a conventional memory configuration used in 10K and 20K PLD devices, such as the FLEX 10K™ or FLEX 20K™, produced by Altera Corporation of San Jose, Calif. This configuration contains RAM blocks (called Embedded Array Blocks, or "EABs"), with each EAB block containing ~4K bits of memory. FIG. 1 shows such a conventional EAB 110 associated with a group of LABs 120.

The input/output widths of EAB blocks 110 are configurable, from 1x bit wide to 16 bits wide. Thus, a single EAB block can be configured to be narrow and deep (1 bit wide by 4K words deep), or relatively wide and shallow (16 bits wide by 256 words deep). Each EAB block is independent from other EAB blocks, with its own independent read/write addresses, decoding logic, and routing resources. This solution is typically more efficient at creating large RAM blocks than using the configuration memory for the LUT from each LE. However, because of the relatively high cost of input/output registers, output drivers, and associated input/output routing resources, it is typically too expensive to support widths greater than 16 bit word or 32 bit word in a single EAB block. Thus, it is less efficient at creating very wide (256 bits) and very shallow (~16 words) RAMs.

Another method of implementing wide/shallow and narrow/deep RAMs is to have a heterogeneous mixture of RAMs. For example, there may be EAB blocks that have 4K bits, and EAB blocks that contain only 256 bits of memory. The disadvantage to this solution is that designs may not require RAM blocks in the same ratio as are on the PLD, leading back to the inefficient stitching of smaller EAB blocks to create larger RAMS, or wasting the larger EAB blocks as smaller capacity RAMs. Additionally, the extra registers and routing resources required to support the maximum total RAM width ever required is rather expensive. These extra registers are also a complete waste for designs that do not require many wide RAMs.

In methods and circuits according to the present invention, a large EAB block, instead of being implemented as one relatively large 4K block next to a group of LABs, is distributed between multiple LABs.

Figure 2:
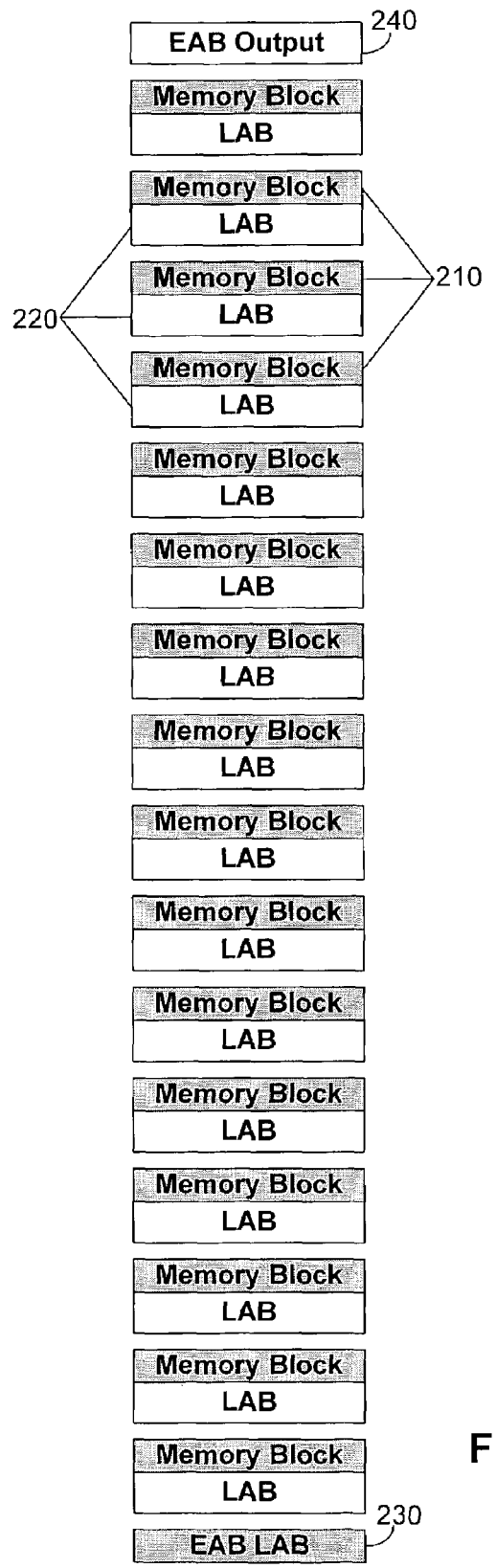
FIG. 2 is a schematic representation of an arrangement of an Embedded Array Block and Logic Array Blocks in a programmable logic device according to the invention.

FIG. 2 shows a circuit according to the invention that incorporates distributed EAB blocks throughout a group of LABs. In this embodiment, the RAM array and row decoders for the EAB may be split into, for example, 16 relatively small memory blocks 210, with each memory block being associated with a different LAB 220.

Adjacent the group of 16 LABs is an EAB LAB 230 that may preferably include, or be associated with, enough routing resources (e.g., interconnects, multiplexers, wiring, and/or other suitable circuitry) and required routing to include two 16-bit data ports, and to generate two 9-bit addresses, and two sets of control signals for CLK, Clock enable, Write-enable and Read-enable. EAB LAB 230 also preferably is associated with EAB LAB output 240. (It should be noted that, for the purposes of this application, the following definitions for conducting wires may be used: general interconnects refer to wiring that is capable, and may be used for, any interconnect that is not particular to any pre-determined portion of the programmable logic device. Global routing lines, which may include global address lines, global data lines, and global control signal lines, may be restricted to conducting signals within a particular LAB or a particular group of LABs. Finally, local interconnect may be used for connecting two adjacent LEs or for providing any intra-LAB routing.)

Figure 3:
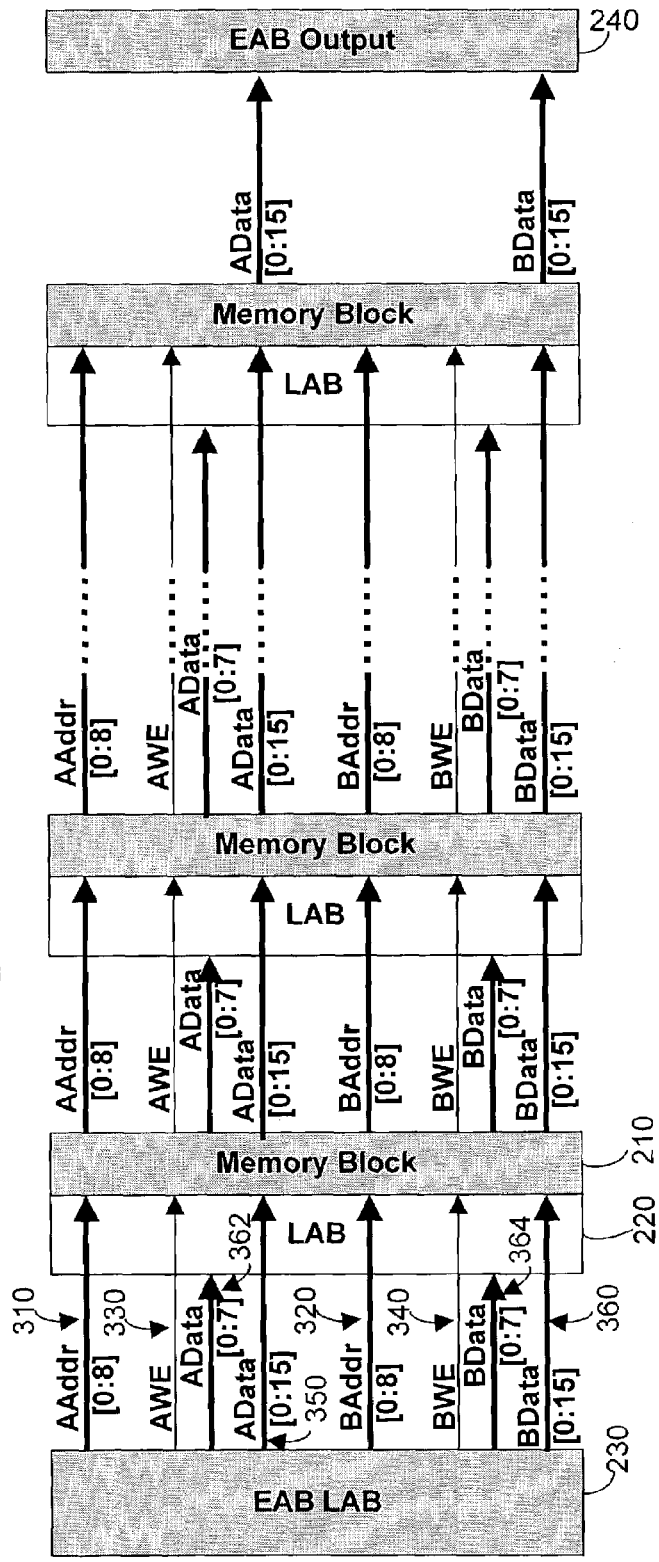
FIG. 3 is a schematic representation of a top-level wiring diagram in a programmable logic device according to the invention.

FIG. 3 shows an exemplary top-level wiring scheme for memory blocks 210 and EAB LAB 230 according to the invention. Address lines 310 and 320, write enable and/or read enable lines 330 and 340, and data lines 350 and 360 preferably run from EAB LAB 230 to the first memory block 210, and from the first memory block to successive memory blocks 210. Data lines also run from final memory block 210 to EAB output 240. Address, data, and control lines 310–360 preferably span 16 memory blocks 210 and 16 LABs 220, and may be used to write and read data from any one, or all, 16 memory blocks 210. It should be noted that data lines 362 and 364 may also transmit "A" and "B" data signals [0:7] in order for those data signals to be used as inputs for LABs 220 as will be explained below in more detail in the description corresponding to FIG. 4. Each of the lines in this application may be generically referred to as "signal lines." Signal lines may refer to any or all of the lines for transmitting signals or other data described herein.

If necessary or desired, address lines, data lines, clock lines and write/read enable lines can be routed on a dedicated layer of metal so as to not interfere with—i.e., to be independent of—the wiring that already exists in and between LABs 220. Also preferably associated with EAB LAB 230 are programmable registers for optionally latching signals on the address lines, control lines, and data lines before the signals are output to the LABs and the memory blocks. Programmable registers are also preferably associated with EAB output 240 to allow for programmable registers for latching the outputs of the data lines.

Figure 4:
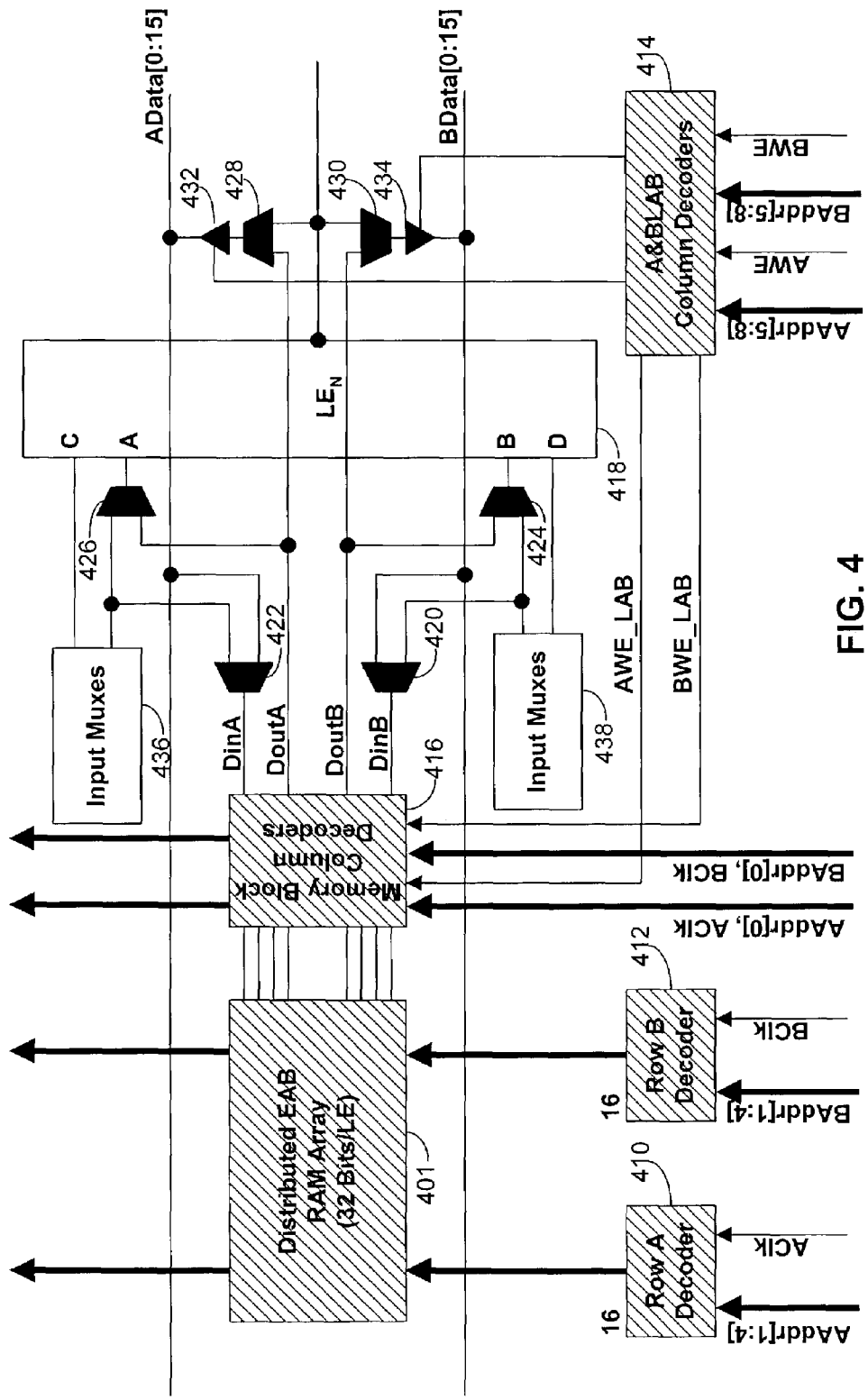
FIG. 4 is a schematic representation of a low-level wiring diagram showing a Logic Element with distributed RAM in a programmable logic device according to the invention.

FIG. 4 shows a more detailed diagram of the LAB 220 and the memory block 210 from FIG. 3. FIG. 4 demonstrates how the signals generated from multiplexers 436 and 438 can be used either as inputs to logic element 418 or as inputs to the memory block 401 via column decoder circuitry 416.

FIG. 4 illustrates an exemplary memory block portion 401 (one of eight total portions in a given LAB which may be understood to represent portions of memory block 210 as shown in FIGS. 2 and 3 or memory block 210 itself) and an associated logic element 418. The convention with respect to interconnecting lines in FIG. 4, and for the application generally, is that a black dot indicates that a connection between interconnecting lines exists. Otherwise, no connection preferably exists between interconnecting lines. Furthermore, arrow ends, or where the line terminates in a box, indicate that the lines may provide data to the destination element or receive data therefrom.

FIG. 4 includes circuitry that generally occurs only once in each LAB—i.e., memory block 401, (which, as described above, represents memory block 210 in FIGS. 2 and 3) and circuits 410, 412, 414, and 416. Circuits 410, 412, 414, and 416 are used to generate and/or decode column-select signals that are common to the memory blocks associated with a single LAB.

Memory block 401 and circuits 410, 412, 414, and 416 are shown as hatched boxes in order to differentiate between these circuits and the rest of the circuitry shown in FIG. 4 which is specifically associated with logic element 418 of LAB 220. Each LAB typically contains eight such logic elements, each of which is associated with its own copy of such specific circuitry.

In FIG. 4, each of the address lines (310 and 320 in FIG. 4) are shown as three individual inputs, AAddr [0], AAddr [1:4], and AAddr [5:8]; and BAddr [0], BAddr [1:4], and BAddr [5:8]. Furthermore, AClk (clock signals for the A group) and BClk (clock signals for the B group) have been shown as well. The A and B data lines, Adata [0:15] and Bdata [0:15], and the A write enable and B write enable lines are also indicated.

Also included in FIG. 4 are Row A Decoder 410 and Row B Decoder 412, which receive the first four bits of the A and B addresses and clock signals, respectively, and A & B LAB column decoders 414 which receive the second four bits of the A and B addresses and write enable signals, respectively. Memory block column decoders 416 preferably receives AWE LAB and BWE LAB outputs from A & B LAB column Decoders 414 and AAddr [0], BAddr [0], AClk and BClk signals.

In this particular embodiment, each of the smaller memory block portions 401 (as noted above) may be adapted to contain 32 8-bit words, and may be dual port, wherein each port may be used for either writing into or reading from. These 8-bit words may be addressed by the lower 5 bits of the address bus, Addr [0:4], coupled to the block using row decoders 410, 412 preferably present in each block (although the EAB LAB may have already partially decoded these address lines).

Also associated with each memory block is a fixed column decoder 414 that may be fed by the upper 4 bits, Addr [5:8], of each address bus. Additionally, each block preferably includes read-enable and write-enable lines (each read-enable and write-enable line may be combined into a single line which toggles from HIGH to LOW), AWE and BWE, that control whether data is being read from or written to the selected word in that block (again, EAB LAB 230 may have partially decoded some of these lines).

If the block portion 401 is being read from, then the output of the addressed word in the block portion 401 is driven onto the data lines through memory block column decoders 416—even block portions drive their 8 outputs of data, respectively, onto the upper 8 bits of the corresponding 16 data lines [0:7], and odd block portions drive their 8 outputs of data, respectively, onto the lower 8 bits of the corresponding data lines [8:15].

Likewise, block portions 401 may be written to. When block portion 401 is being written to, even block portions may receive their 8 bits of data from the lower 8 bits of the corresponding data lines and odd block portions may receive their 8 bits of data from the upper 8 bits of the corresponding data lines.

Typically, for each address, only one memory block portion 401 will be enabled at a time—thus, one 8-bit word may be read from or written to at one time per address. However, in one embodiment of the invention, each block portion may preferably be programmable to mask out the lowest address bit, allowing up to two block portions or two memory blocks, to be addressed at once (in one preferred embodiment, an even and odd block). This allows reading and writing of one 16-bit word at a time per address.

In order to implement relatively very wide and shallow RAM according to the invention, each memory block portion 401 (or memory block 210) can also preferably be independently placed into a mode where one or both of its 8-bit ports can directly feed an input to one of the LEs in the adjacent LAB. Thus, the eight outputs of the first "port" of memory block portion 401 (or memory block 210) can be made to unconditionally feed the "A" input of one or more of LE1 through LE7—e.g., LE 418—of the adjacent LAB, while the eight outputs of the second "port" of memory block portion 401 can be made to unconditionally feed the "B" input of the same eight LEs.

Each of these different architectures, as well as the various architectures set forth below, may be implemented using logic elements that include multiplexers (muxes) 420, 422, 424, 426, 428, 430, and tri state circuits 432 and 434.

In one embodiment of the invention, memory block portion 401 can be independently programmed to receive inputs directly from input multiplexers 436 and 438 that normally feed the "A1" and "B" inputs of these same LEs. Thus, each memory block 210 in a circuit according to the invention can simultaneously read up to two 128-bit wide words from EAB LAB 230 and apply them to the inputs of 128 LEs—e.g., at inputs A, B, C, and D (though FIG. 4 shows that only the lines feeding A and B inputs are adapted to provide signals to memory block 401, it is within the scope of the invention also to provide the signals from the lines feeding inputs C and D to memory block 401 as well) of eight different LEs in a single LAB. It should be noted that this simultaneous reading up to two 128-bit words requires no extra routing to perform any 1 LE function on these two long words, as would be the case if these EABs were grouped independently from the LABs, as in the prior art.

Figure 5:
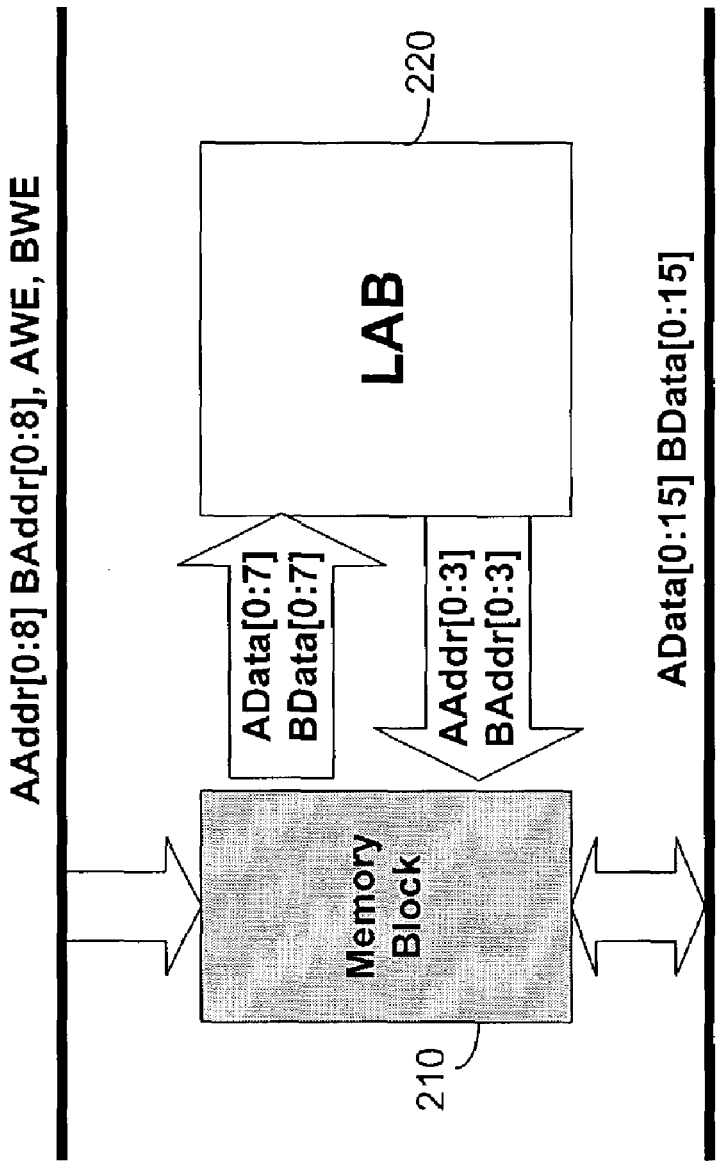
FIG. 5 is a schematic representation representing signal selection according to the invention.

FIG. 5 shows the flexible addressing approach that forms one of the basic concepts of the invention. In FIG. 5, it is shown that a single memory block 210 may preferably receive the first four address bits, AAddr [0:3] and Baddr [0:3] from either the address lines or adjacent LAB 220. In this way, a flexible addressing scheme for each of the memory blocks is preferably implemented. The addressing scheme according to the invention provides flexibility to the implementation of the individual memory blocks—i.e., the memory blocks may either be written to or read from as a group using wide words, or, alternatively, may be written to, or, read from, individually.

FIG. 5 also shows that memory block 210 may preferably drive at least a portion of the data output signals into LAB 220 associated with memory block 210. This embodiment preferably allows the LABs to receive data as a single entity. Such an embodiment obviates the need for extra routing resources to transfer the data from the memory blocks to the LAB by configuring the data input to the LABs using the memory blocks. This aspect of the present invention as well as the other aspects of FIG. 5—e.g., that memory block 210 preferably may receive AWE, BWE signals, may receive data from a data line, and may transmit data signals to the LAB, or alternatively to the data lines—are also shown, albeit from a wiring perspective, in FIG. 4.

Figure 6:
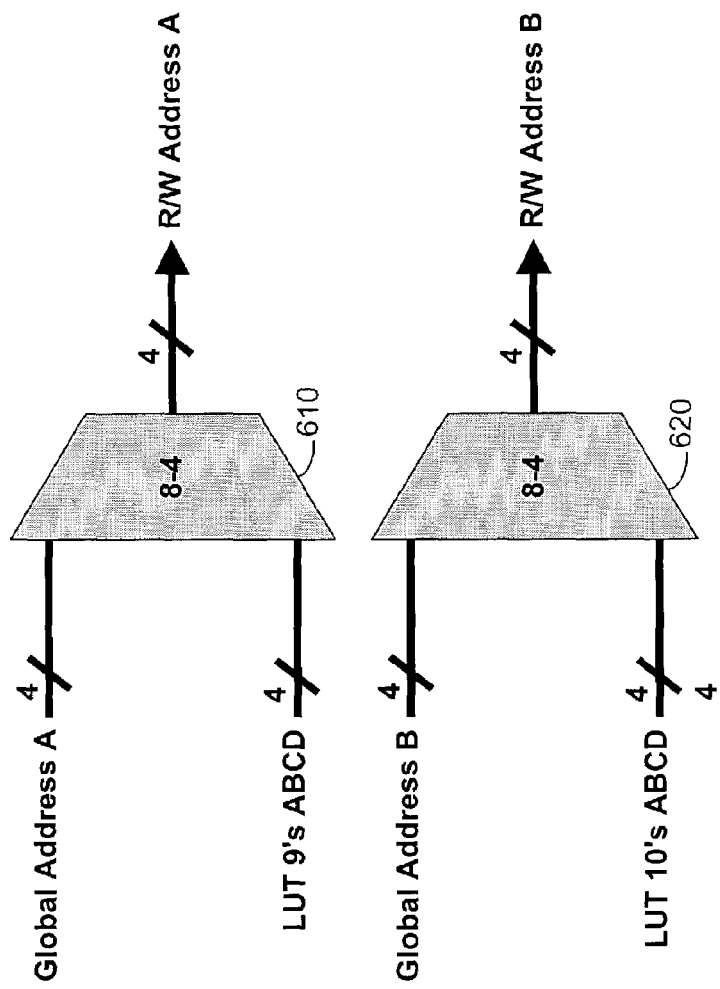
FIG. 6 is a schematic representation representing address selection according to the invention.

FIG. 6 also shows yet another aspect of the flexibility of an addressing scheme according to the invention. In FIG. 6, mux 610 may be implemented to transmit signals from either four global address lines or from the four inputs of LUT 9 to four Read/Write Addresses of port A. Mux 620 may be implemented to transmit signals from either four global address lines or from the four inputs of LUT 10 to four Read/Write Addresses of port B. The implementation embodied in FIG. 6 illustrates another aspect of the implementation described with respect to FIG. 5.

In yet another embodiment of the invention, if each LE contained a 4-input LUT, then each LE could be used to implement a function of the bits from two output ports of the adjacent memory block plus two extra inputs (preferably obtained from input muxes). FIG. 4 shows a four-input LUT. If muxes 426 and 424 are configured to select DoutA and DoutB as the inputs to the "A" and "B" inputs of the LUT respectively, then the LUT is fed by two outputs from memory block 416, as well as by two arbitrary signals which may be received from the global routing lines, or even the general interconnect (not shown). These two arbitrary signals may be routed to the "C" and "D" inputs of LE 418 via input muxes 436 and 438, respectively. Thus, the LUT can be programmed to implement a pre-selected function of the bits from two output ports, plus two extra signals. For example, one useful function that the LUT could be programmed to implement a logical AND of the XNOR of inputs "A" and "C" and the XNOR of inputs "B" and "D". This tests if DoutA (feeding input "A") is equal to the arbitrary signal on the "C" input and if DoutB is equal to the arbitrary signal on the "D" input.

In addition, if the LEs can be configured as an adder, then two 128-bit outputs may be added together as follows. It may be possible to configure the LE 418 so that it adds the input values on its "A" and "B" inputs [Altera's STRATIX™ and APEX™ family of devices implement such a logic cell]. Such a logic cell would typically also have a dedicated carry-in and a dedicated carry-out signal, where the carry-in signal of the logic cell is fed by the carry-out of the previously adjacent logic cell, and the carry-out is connected to the carry-in of the following adjacent logic cell. These carry-chains (carry-in/carry-out pairs) would allow two N-bit words to be added together by feeding them into the "A" and "B" inputs of N adjacent LEs. These carry chains could span multiple LABS, so that the carry-out from the last logic cell in one LAB was used as the carry-in to the first logic cell of the immediately adjacent LAB. This would allow adding long—e.g., 128-bit—numbers. When adding long numbers together from the output of a wide—i.e., stiched together—memory block, multiple LABs will thus be used, where the source of the bits may come from the outputs of the memory blocks associated with each of the LABs. (The carry circuitry and the carry-in/carry-out signals not shown).

If it is possible to configure logic cell 418 so that it adds the inputs values on its "A" and "B" inputs, as described above, then such a configuration would allow the "DoutA" and "DoutB" of the memory block 416 to be added together by configuring muxes 426 and 424 to connect "DoutA" to "A" and "DoutB" to "B", respectively.

Adding the two 128-bit outputs can be particularly useful for generating a multiply-by-constant function by using two 4-bit lookups with an individual memory block and then adding the result—which allows a circuit according to the invention to multiply an 8-bit number by an arbitrary length constant.

The LEs could also be configured as a shift register—e.g., to store information for a pre-determined amount of time such as one clock cycle—which would allow the outputs of the associated memory block to be read in parallel and then be shifted out serially. If a 1 LE function on the two wide outputs is not desired, but instead routing the output to some other destination is desired, the LE can be configured as a 2-1 mux—or a simple function of one of the outputs. When the LE is configured as a 2-1 mux, the register in the LE may be used to latch a single wide output and then drive that latched output on to the global lines, or, alternatively, on to general interconnect, using the LE. Even in this case, the LE's LUT is still available for performing simple operations on the output of the associated memory block before sending out the signals.

Whether the input or output is wide for each memory block port is independently programmable—a group of memory blocks acting as a single memory entity, in conjunction with the EAB LAB 230, could be written into using the narrow 8- or 16-bit mode and read from using the 128 bit mode. When performing this process, the address lines for the individual memory blocks are preferably taken from the global address signals supplied by EAB LAB 230.

When reading from this group of blocks in shallow and wide mode, the data outputs of each memory block may be driven into the respective logic cells, which can be programmed with the identity function such that the value from the memory block flows through the logic cell to get on to the global routing lines, or alternatively, the general interconnect. Similarly, when writing to the group of memory blocks in its wide mode, the data for each of the individual memory blocks may come from the input muxes 436 and 438 in each LAB (rather than the global data lines.) When writing into the group of memory blocks in its narrow mode, the data for each of the individual memory blocks may come from the global data lines that are driven by EAB LAB 230.

Likewise, one port could read and write to each memory block in its narrow mode while the other port read and wrote using the 128 wide mode. Because each memory block is independently controllable, one could program only half of the blocks to be in wide mode when only a 64-bit wide output was required, leaving half the LABs completely unaffected and available to be used as general purpose logic. The memory blocks next to these LABs would still be accessible from the other port via the narrow mode.

The above invention described a two port memory block for use as a memory element. In such an embodiment, each port had the ability to either read from an address in the memory block or write to an address in the memory block. A variation on the invention would be to utilize a memory element having have 1 read port and 1 write port.

Circuits according to the invention described each of the memory blocks as being selectively addressable by the upper 4 address lines for each address port. In contrast to the mode where each of the memory blocks are written to individually, another mode could be entered that would allow multiple memory blocks to be loaded in parallel with the same data off of the same 16 data lines. When the memory blocks are addressed individually, the address may be taken from the upper four address lines for each port—i.e., the upper four address lines for each port determines which of the 16 memory blocks are being addressed. This is different from the mode in which all of the memory blocks are written to simultaneously which is controlled, for example, by an additional control signal. In the mode where each of the memory blocks are being written to simultaneously, the upper four address lines are preferably not used for addressing purposes.

Such an embodiment would be useful at least for quickly clearing all of the memory blocks, or for loading a common constant into each of the memory blocks.

In another aspect of the invention, the above invention described each of the memory blocks as having their address lines tied to a common source. It would also be possible to add a programmable mux on the address lines entering each memory block that could select between either the common EAB address lines generated in EAB LAB 230, or from a signal that was unique to that memory block. This would allow different memory addresses to be read from or written to for each memory block simultaneously when in wide mode. Such a configuration may be similar to the configuration shown in FIG. 4 with the exception that the four inputs drawn from the LUTs may be drawn from some alternative source.

With respect to another aspect of the invention, the above invention described a total configurable memory block (albeit split into 16 smaller blocks, see FIG. 2) that could be configured as being 8 (or 16) bits wide by 512 (or 256) words deep in its narrow mode, and up to 128 bits wide by 32 bits deep in its wide mode. tri-stateable circuitry 432 and 434 could also be added to each memory block that would allow the outputs of the LAB 220 (when in its narrow mode) to be conditionally driven onto a set of Tri-stateable lines. For example, at least four of the address lines described above may be used when reading from a group of memory blocks. These four address lines may feed a decoder 414 in each of the 16 memory blocks which would enable the tri-state drivers for that memory block. Thus, each of the sixteen memory blocks may be individually addressed to drive its value onto the global data lines that then feed into EAB LAB 230. This configuration creates a deep RAM that has a relatively narrow—e.g., 16-bit—output port.

In such an embodiment, each LAB preferably includes a dedicated 4-bit decoder for these extra lines that would conditionally—e.g., upon receipt of a unique pattern on the four address lines—enable the write-enable control signal for the memory block, and conditionally enable the tri-stateable outputs for that memory block into the set of tri-stateable lines common to the associated group of 16 memory blocks 210. In this way, it would be possible to stitch memory blocks together to form an eight wide by 8K deep memory block.

The above aspect of the invention described the additional "narrow-mode" data lines as being tri-statable, and the data input and output registers for a RAM as being in the same LAB. It would also be possible to split the data lines into 16 unidirectionally driven data line segments. Each segment would be conditionally driven by either the output of the adjacent memory block, or by the output of the prior segment. This arrangement preferably is similar to the arrangement shown in FIG. 6 wherein four address lines are driven either by the global address lines or by inputs to LUTs in selected LEs.

In this arrangement, the input data registers may preferably be at one end of the 16 LABs—e.g., located in EAB LAB 230 shown in FIG. 2—while the output data register may preferably be at the other end of the 16 LABs—e.g., located in EAB OUTPUT 240 also shown in FIG. 2. The flow of address, data, and control signals may all be considered as going from left to right as shown in FIG. 2.

This arrangement possesses several advantages. Accessing data would be quicker since one would not need to wait for a signal to make a "round-trip" from the address generator on the left side of the circuit, to the memory block on the far end, and then wait for the data read to make the trip back. In fact, it would be possible to "pipeline" data accesses, where a new address is applied to the circuit even before the data of the last access to the circuit has made its way to the far end. Even though the RAM is distributed across 16 LABs, its access time would preferably be constant. Another advantage, is that instead of having tri-stateable drivers in each memory block that are large enough to drive a tri-stateable line 16 LABs in length, simpler drivers can be used instead that feed much shorter line segments. Yet another advantage of a configuration according to this embodiment is that it would be possible to read and write to the same address simultaneously—the data to be written into Nth block is driven on the first N wire segments, and then the memory block drives its output onto the last 16 N wire segments. This would not be possible (or would require double number of wire channels) if a tri-stateable bus were used for the data lines.

The invention above described the address, control, and data signals as coming from a dedicated EAB LAB 230 that includes sufficient routing resources to generate and transmit all the signals. These routing resources may be fairly substantial. Therefore, it may be desirable to share these routing resources with those of the adjacent LAB 210. For example, the routing resources (or "input muxes") that feed the LUT inputs of the LEs in the adjacent LAB could be redirected to act as the sources for address, control, and data in signals. It should be noted, however, that such redirection of the LAB resources may disable the LAB or at least portions of the LAB, from its typical logic functions.

The invention above described the memory blocks as being next to each LAB in a group of LABs. It would also be possible for the memory blocks to skip one or more LABs. For example, memory blocks could be placed between every other LAB in a group of LABs without departing from the scope of the invention. This would decrease the number of memory blocks with respect to the number of logic elements in the programmable logic device, thereby reducing the area overhead associated with the unnecessary memory blocks.

Thus, it is seen that systems and methods for providing a versatile RAM for a Programmable Logic Device have been provided. One skilled in the art will appreciate that the present invention can be practiced by other than the described embodiments, which are presented for purposes of illustration rather than of limitation, and the present invention is limited only by the claims which follow.

What is claimed is:

1. A programmable logic device having a versatile Random Access Memory (RAM), the device comprising:
   a logic array block comprising:
      a plurality of multiplexers that drive output signals from the logic array block onto a plurality of global routing lines, wherein a selected portion of the global routing lines are adapted for transmitting output signals from the logic array block into the RAM, wherein the RAM comprises a plurality of memory blocks, wherein each of the memory blocks is associated with a decoder, and wherein each decoder that detects a unique pattern on at least one of the selected portion of the global routing lines enables a tri-state-driver that drives the output of the memory block associated with the decoder onto the at least one global routing line;
   a logic element comprising a plurality of inputs;
   a plurality of signal lines that:
      in a first configuration of the programmable logic device, provide address signals that, at least in part, specify a location in the RAM, the location that is adapted to be either written to or read from; and
      in a second configuration of the programmable logic device, provide a plurality of input signals to the inputs of the logic element.

2. The device of claim 1, wherein, in a third configuration of the programmable logic device, the signal lines provide a plurality of address signals that, at least in part, specify a location in the RAM, the location that is adapted to be either written to or read from.

3. The device of claim 1, wherein, in a third configuration of the programmable logic device, the signal lines provide a plurality of address signals that, at least in part, specify a location in the RAM, the location that is adapted to be read from in order to provide input signals to the logic element.

4. The device of claim 1, wherein the RAM comprises outputs, the outputs that are adapted to provide a second plurality of input signals to the logic element.

5. The programmable logic device of claim 1, further comprising input multiplexers that provide signals to the signal lines.

6. The programmable logic device of claim 1, further comprising a routing resource, the routing resource comprising interconnects, multiplexers, and wiring in order to generate and transmit to the RAM:
   two multi-bit addresses; and
   two sets of control signals, the control signals for generating at least one of a clock signal, a clock enable signal, a write-enable signal, and a read-enable signal.

7. The programmable logic device of claim 1, further comprising a selected portion of the global routing lines for receiving output signals from the RAM.

8. The programmable logic device of claim 1, wherein the RAM is adapted to transmit output signals to one of a) the selected portion of the plurality of global lines and b) the logic element.

9. The programmable logic device of claim 8, wherein the logic element is located in the Logic Array Block adjacent to the RAM.

10. The programmable logic device of claim 8, when the RAM drives its output signals to the logic element, the input signals are transmitted to the RAM for use as data signals or address signals.

11. The programmable logic device of claim 1, further adapted to select whether a plurality of input signals to the RAM are received from the signal lines or from global routing lines.

12. The programmable logic device of claim 1, the logic array block further comprising a plurality of registers for registering the output signals before they are driven onto the plurality of global routing lines.

13. The programmable logic device of claim 1, the logic array block further comprising a plurality of registers for registering the output signals before they are driven onto a general interconnect.

14. The programmable logic device of claim 1, wherein the multiplexers are adapted to drive the output signals onto a selected portion of the plurality of global routing lines.

15. The programmable logic device of claim 1, further comprising global address lines and a selected portion of the global address lines that enable which memory block receives an input data signal.

16. The programmable logic device of claim 1 further comprising a global control signal and wherein the global control signal enables the simultaneous writing of data into each of the plurality of memory blocks.

17. The programmable logic device of claim 1, further comprising a plurality of global data lines, a selected portion of the global data lines for receiving output signals from the logic element, wherein each memory block decoder that detects a unique pattern on at least one of the selected portion of the global data lines enables a tri-state-driver that drives the output of the logic element associated with the decoder onto the at least one global data line.

18. The programmable logic device of claim 1, the RAM comprising a plurality of outputs that are coupled to feed the logic element.

19. The programmable logic device of claim 18, the logic element being programmed to perform a logical or arithmetic function on signals received from the RAM.

20. The programmable logic device of claim 18, the logic element being programmed to perform a logical or arithmetic function on signals received from a global interconnect the RAM.

21. A programmable logic device having a versatile Random Access Memory (RAM), the device comprising:
   a plurality of multiplexers that drive output signals from the RAM onto a plurality of global routing lines, wherein a selected portion of the global routing lines are adapted for transmitting output signals from the logic array block into the RAM, wherein the RAM comprises a plurality of memory blocks, wherein each of the memory blocks is associated with a decoder, and wherein each decoder that detects a unique pattern on at least one of the selected portion of the global routing lines enables a tri-state-driver that drives the output of the memory block associated with the decoder onto the at least one global routing line;
   a logic element comprising a plurality of inputs; and
   a plurality of signal lines that:
      in a first configuration of the programmable logic device, provide data signals that, at least in part, provide data for writing to or reading from a location in the RAM; and
      in a second configuration of the programmable logic device, provide a plurality of input signals to the inputs of the logic element.

22. A programmable logic device having a versatile Random Access Memory (RAM), the device comprising:
   a plurality of multiplexers that drive output signals from the RAM onto a plurality of global routing lines, wherein a selected portion of the global routing lines are adapted for transmitting output signals from the logic array block into the RAM, wherein the RAM comprises a plurality of memory blocks, wherein each of the memory blocks is associated with a decoder, and wherein each decoder that detects a unique pattern on at least one of the selected portion of the global routing lines enables a tri-state-driver that drives the output of the memory block associated with the decoder onto the at least one global routing line;
   a logic element comprising a plurality of inputs; and
   a plurality of signal lines that:
      in a first configuration of the programmable logic device, provide control signals that, at least in part, provide at least one of the Clock signal, Clock enable signal, Write-enable signal and Read-enable signal associated with the RAM, the location that is adapted to be either written to or read from; and
      in a second configuration of the programmable logic device, provide a plurality of input signals to the inputs of the logic element.

23. A programmable logic device having a versatile Random Access Memory (RAM), the device comprising:
   a plurality of logic array blocks, each of the logic array blocks comprising a plurality of logic elements and a plurality of multiplexers that drive output signals from the logic array block onto a plurality of global routing lines, wherein a selected portion of the global routing lines are adapted for transmitting output signals from the logic array block into the RAM, wherein the RAM comprises a plurality of memory blocks, wherein each of the memory blocks is associated with a decoder, and wherein each decoder that detects a unique pattern on at least one of the selected portion of the global routing lines enables a tri-state-driver that drives the output of the memory block associated with the decoder onto the at least one global routing line; and an embedded array block logic array block (EAB LAB), wherein the EAB LAB is adapted to receive a plurality of signals from a general interconnect, register at least a portion of the plurality of signals drive at least a portion of the plurality of signals via global signal lines to one of the RAM and the plurality of logic array blocks.

24. A programmable logic device having a versatile Random Access Memory (RAM), the device comprising:
- a plurality of logic array blocks, each of the logic array blocks comprising a plurality of logic elements and a plurality of multiplexers, wherein a selected portion of the global routing lines are adapted for transmitting output signals from the logic array block into the RAM, wherein the RAM comprises a plurality of memory blocks, wherein each of the memory blocks is associated with a decoder, and wherein each decoder that detects a unique pattern on at least one of the selected portion of the global routing lines enables a tri-state-driver that drives the output of the memory block associated with the decoder onto the at least one global routing line; and
- an embedded array block output logic array block (EAB Output LAB), wherein the EAB Output LAB is adapted to receive a plurality of signals from global lines, register at least a portion of the plurality of signals and drive via the multiplexers at least a portion of the plurality of signals onto a general interconnect.

25. A programmable logic device having a versatile Random Access Memory (RAM), the device comprising:
- a logic array block comprising:
  - a plurality of multiplexers that drive output signals from the logic array block onto a plurality of global lines, wherein a selected portion of the global routing lines are adapted for transmitting output signals from the logic array block into the RAM, wherein the RAM comprises a plurality of memory blocks, wherein each of the memory blocks is associated with a decoder, and wherein each decoder that detects a unique pattern on at least one of the selected portion of the global routing lines enables a tri-state-driver that drives the output of the memory block associated with the decoder onto the at least one global routing line;
  - a logic element comprising a plurality of inputs; and
  - a plurality of signal lines that:
    - in a first configuration of the programmable logic device, provide address signals or data signals to the RAM based on signals taken from the global lines;
    - in a second configuration of the programmable logic device, provide address signals or data signals to the RAM based on signals taken from the local interconnect; and
    - wherein the RAM determines whether the programmable logic device is in the first configuration or second configuration.

26. A programmable logic device including a plurality of logic blocks, each of the blocks including a plurality of logic elements, a plurality of multiplexers, each of the multiplexers driving output signals from the logic blocks onto a plurality of global routing lines, wherein a selected portion of the global routing lines are adapted for transmitting output signals from the logic array block into the RAM, and distributed memory blocks each of the memory blocks associated with a logic block, the programmable logic device comprising:
- a versatile addressing circuit wherein:
  - in a first configuration of the programmable logic device, the versatile addressing circuit provides input signals to the logic elements;
  - in a second configuration of the programmable logic device, the versatile addressing circuit provides addressing signals that may be used to identify addresses in the memory blocks, the addresses that may be either written to or read from; and
- wherein the RAM comprises a plurality of memory blocks, wherein each of the memory blocks is associated with a decoder, and wherein each decoder that detects a unique pattern on at least one of the selected portion of the global routing lines enables a tri-state-driver that drives the output of the memory block associated with the decoder onto the at least one global routing line.

27. A programmable logic device comprising:
Random Access Memory (RAM) including memory block portions;
a plurality of multiplexers that drive output signals from the memory block portions onto a plurality of segmented global data lines, each of the segments corresponding to a memory block portion, the plurality of segments for transmitting data inputs to and from the memory block portions wherein a first memory block portion receives first data signals from a corresponding segment of the segmented global data lines, each of the memory block portions being associated with a decoder, and wherein each decoder that detects a unique pattern on at least one of the segmented global data lines enables a tri-state-driver that drives the output of a logic element associated with the decoder onto the at least one segmented global data line; and
in a first configuration of the programmable logic device, the first memory block portion transmits the first data signals received to the segment of the segmented global data lines that corresponds to a second memory block; and
in a second configuration of the programmable logic device, the first memory block reads data based on the first data signals and transmits second data signals to the second memory block via the segmented global data lines.

* * * * *